United States Patent [19]

Suzuki

[11] Patent Number: 4,935,174
[45] Date of Patent: Jun. 19, 1990

[54] RESIN MOLDED ARTICLE BEARING ELECTRIC CIRCUIT PATTERNS AND PROCESS FOR PRODUCING THE SAME

[75] Inventor: Osamu Suzuki, Yokohama, Japan

[73] Assignee: Canon Kabushiki Kaisha, Tokyo, Japan

[21] Appl. No.: 408,942

[22] Filed: Sep. 18, 1989

Related U.S. Application Data

[63] Continuation of Ser. No. 1,569, Jan. 8, 1987, abandoned.

[30] Foreign Application Priority Data

| Jan. 13, 1986 | [JP] | Japan | 61-5824 |
| Jan. 13, 1986 | [JP] | Japan | 61-5825 |
| Dec. 3, 1986 | [JP] | Japan | 61-186466[U] |
| Dec. 10, 1986 | [JP] | Japan | 61-190126[U] |
| Dec. 12, 1986 | [JP] | Japan | 61-297424 |
| Dec. 25, 1986 | [JP] | Japan | 61-199906[U] |

[51] Int. Cl.$^5$ .................................................. B29C 45/00
[52] U.S. Cl. ............................................. 264/24; 264/112;
264/121; 264/128; 264/255; 264/272.14;
264/517; 425/3; 425/DIG. 33
[58] Field of Search .............. 361/395, 398, 399, 406, 361/409, 412; 264/24, 112, 121, 128, 255, 272.14, 328.12, 328.18, 517; 425/3, DIG. 33

[56] References Cited

U.S. PATENT DOCUMENTS

| 2,465,276 | 3/1949 | Ryder | 425/DIG. 33 X |
| 3,271,627 | 9/1966 | McDougal | 317/112 |
| 3,290,756 | 12/1966 | Dreyer | 361/398 X |
| 3,504,063 | 3/1970 | Lemelson | 425/3 X |
| 3,590,136 | 6/1971 | Kunishi et al. | 361/394 X |
| 3,846,223 | 11/1974 | Lederman et al. | 264/328.12 |
| 4,180,711 | 12/1979 | Hirata et al. | 361/398 X |
| 4,218,724 | 8/1980 | Kaufaman | 361/399 X |
| 4,584,767 | 4/1986 | Gregory | 174/68.5 X |
| 4,603,930 | 8/1986 | Ito | 361/399 X |
| 4,624,798 | 11/1986 | Gindrup | 252/513 X |
| 4,666,387 | 5/1987 | Yokota et al. | 425/3 |
| 4,677,252 | 6/1987 | Takahashi et al. | 174/68.5 |

FOREIGN PATENT DOCUMENTS

| 0101011 | 6/1985 | Japan . |
| 0063423 | 4/1986 | Japan . |
| 0208892 | 9/1986 | Japan . |

Primary Examiner—Gregory D. Thompson
Attorney, Agent, or Firm—Fitzpatrick, Cella, Harper & Scinto

[57] ABSTRACT

In a mold having a pattern forming portion composed of a magnetic material, a pattern is formed by magnetically depositing a magnetic material on the wall of a cavity of the mold, and a resinous material is then injected into the cavity for molding and simultaneously transferring the pattern onto the surface of thus molded article.

2 Claims, 9 Drawing Sheets

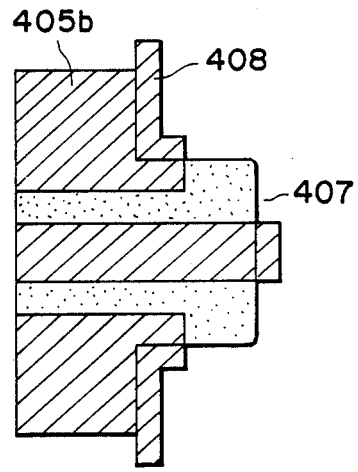
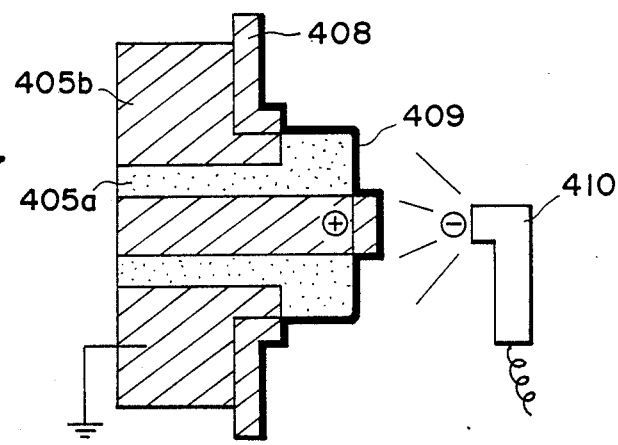
FIG. 19A    FIG. 19B
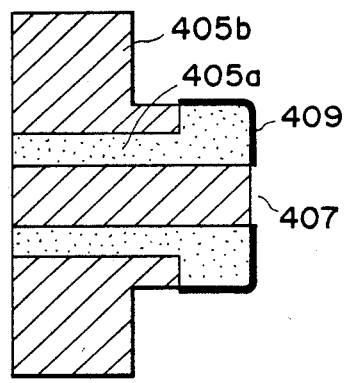
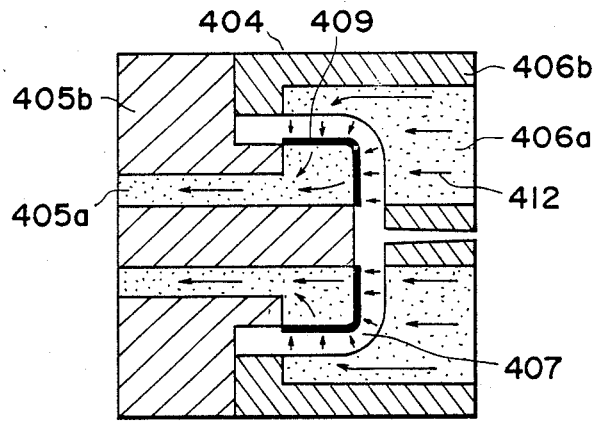
FIG. 19C    FIG. 19D
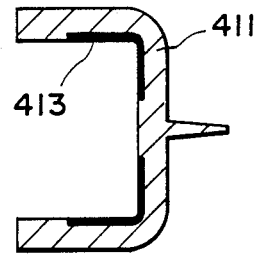
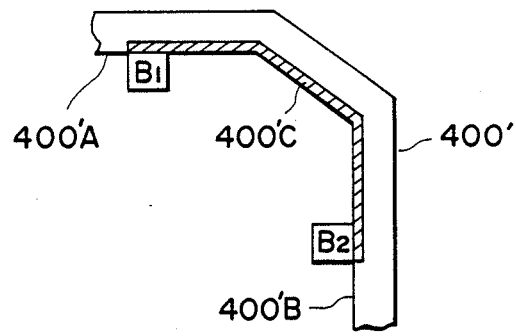
FIG. 19E    FIG. 20

RESIN MOLDED ARTICLE BEARING ELECTRIC CIRCUIT PATTERNS AND PROCESS FOR PRODUCING THE SAME

This application is a continuation of application Ser. No. 001,569 filed Jan. 8, 1987, now abandoned.

BACKGROUND OF THE INVENTION

1. Field of the Invention

The present invention relates to an electric equipment, in particular, imaging equipment such as photographic cameras or magnetic recording cameras, electronic office equipments such as copying machines or computers, or communication equipment, provided with electric or electronic circuits therein, and involving electronic circuit assembly by forming such circuits on rigid circuits boards or flexible circuit boards and incorporating such circuits in the electric equipment.

More particularly, the present invention relates to a process for forming a circuit pattern on a resin molded article adapted for use as a body or a cover of an electric equipment, or an intermediate member to be mounted on said body or cover.

2. Related Background Art

In a photographic camera or a camera for video tape recorder, various circuits such as a light-measuring circuit, an exposure calculating circuit and an automatic focusing circuit for driving a diaphragm mechanism, a shutter mechanism, a lens etc., are required, and the components constituting such circuits, such as transistors, resistors, capacitors, coils, IC's, LSI's, etc. are soldered onto circuit patterns formed on rigid or flexible circuit boards.

Due to the increasing use of electric control and the increasing complexity of electric circuits with highly integrated circuit components for achieving higher performance, cameras are requiring an increased number of circuit boards, and rationalization in electric circuit assembly is required for compactization, efficient equipment assembly and efficient replacement or repair of components.

A flexible printed circuit can be provided in a narrow space due to its flexibility, but requires a certain space when the aforementioned components are fixed thereon by soldering. Also flexible printed circuits employed as connecting portions B3, B4 shown in FIG. 1 for connecting a photometric circuit block B1 and an exposure calculating block B2, results in a complicated assembly since said flexible circuit has to be placed over a long distance in the camera. These drawbacks, of course, are not limited to cameras but are generally found in electric equipment.

SUMMARY OF THE INVENTION

An object of the present invention is to provide a process for producing a resin molded article bearing electric circuit patterns or terminals patterns and serving as a body, a cover or an intermediate member of an electric equipment, as well as such article. The above-mentioned object can be achieved, according to the present invention, by one of following two processes.

In a first process, in forming a pattern with a patterning material containing a magnetic material on a mold for producing a molded article, said pattern is formed on a pattern supporting member, and said pattern is thereafter transferred onto a mold member.

In a second process, there is provided a mask member for coating a patterning material in a required portion of the mold member, and said patterning material is coated through said mask member onto the mold member to form a pattern thereon.

A further object of the present invention is to provide a process of assembly of an electric equipment utilizing the article obtained by either of the processes mentioned above.

With respect to said further object, it is proposed to reduce the number of circuit boards such as rigid circuit boards or flexible circuit boards thereby realizing simple and reasonable form of circuit assembly and resolving the aforementioned drawbacks in the prior technology.

The above-mentioned reduction in the number of circuit boards can be achieved by directly forming circuit patterns on a body or a cover of the electric equipment or an intermediate member to be fixed in said body. In the example shown in FIG. 1, a block 3 and circuit patterns B3, B4 for connecting the circuit blocks B1 and B2 are formed directly on a body, a cover or an intermediate member thereby dispensing with the portions of said circuit patterns B3 and B4.

A still further object of the present invention is to provide a process of electric circuit assembly of forming circuit patterns on a face of said resin molded article and connecting circuit blocks, formed on other surfaces facing said face of the resin molded article, with circuit patterns formed thereon.

BRIEF DESCRIPTION OF THE DRAWINGS

FIGS. 2 to 5B illustrate a process of image transfer wherein FIG. 2 is a schematic cross-sectional view of a mold;

FIG. 3 is a schematic view of a magnetic flux for depositing a pattern on a mold;

FIG. 4 is a schematic view of an image transfer;

FIGS. 5A and 5B illustrate a resin molded article and an electric circuit assembled therewith;

FIGS. 6 to 11 illustrate a process of forming a pattern in a required portion by coating through a mask; wherein FIG. 6 is a schematic cross-sectional view of a mold;

FIGS. 7 to 10 are schematic views showing the pattern forming process;

FIG. 11 is a cross-sectional view of a molded article;

FIGS. 12 to 13E illustrate examples of electric circuit assembly utilizing the foregoing processes; wherein FIG. 12 is a cross-sectional view showing a pattern formed on a resin molded article and an electric circuit board attached thereto;

FIGS. 13A to 13E are schematic views showing a pattern forming process;

FIGS. 14 to 16E illustrate examples of electric circuit assembly utilizing connectors; wherein FIG. 14 is a cross-sectional view;

FIG. 15 is a perspective view;

FIGS. 16A to 16E are schematic views showing a pattern forming process;

FIGS. 19A to 19E are schematic views showing a molding process; and

FIG. 20 is a partial cross-sectional view of a resin molded article constituting another embodiment.

DETAILED DESCRIPTION OF THE PREFERRED EMBODIMENTS

At first there will be explained a process in which a patterning material is supported by a pattern supporting member and is transferred onto a mold member, while making reference to FIGS. 2 to 5B.

Figure 2:
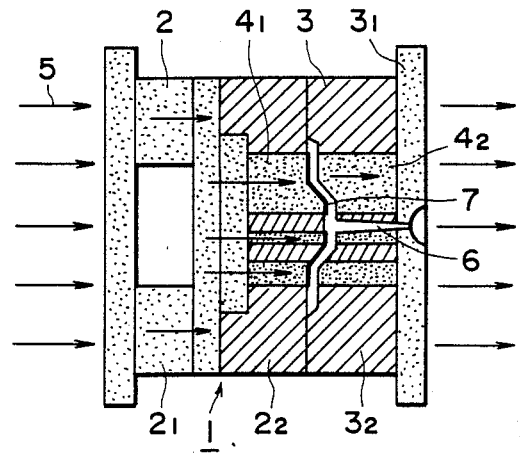

In FIG. 2, a mold 1 is composed of a male mold 2 and a female mold 3, which are composed of magnetic portions $2_1$, $3_1$ for example of carbon steel, and non-magnetic portions $2_2$, $3_2$ for example of BeCu manufactured by Nippon Glass, YHD-50 manufactured by Hitachi Metal, NM-II manufactured by Nippon Kokan, sintered cobalt metal manufactured by Mitsubishi Metal or austenite steel SUS 303 or SUS 304. A cavity face of the movable male mold 2 is provided, for forming a circuit pattern, with a circuit pattern forming portion composed of a magnetic material of a high magnetic permeability and a high saturation magnetic flux density, such as a low-carbon steel, SKD61, SKD11, NAK-55 manufactured by Daido Special Steel, ASSABXW-10 manufactured by Assab Special Steel, Ferrotic C manufactured by Chugai Denko etc. Also the cavity face of the fixed female mold 3 is provided with a magnetic member $4_2$ constituting a counter magnetic pole.

Arrows 5 indicate magnetic flux passing through the mold, and there is provided a sprue 6 for injecting resin into the mold 1. Outside the magnetic portions $2_1$, $3_1$ there are provided unrepresented coils for generating the magnetic flux. In the above-explained structure, the magnetic flux applied to the mold 1 passes through the magnetic portion $2_1$, reaches a maximum density in the pattern forming portion $4_1$, then passes through the counter magnetic pole $4_2$ and finally passes through the female mold 3. It is to be noted that the magnetic flux does not go through the non-magnetic portions $2_2$, $3_2$. Thus, on the cavity face of the movable female mold 2, the circuit pattern forming portion $4_1$ shows magnetic attraction while other portions do not. Consequently the circuit pattern forming portion $4_1$ forms a magnetic latent image.

Then the mold 1 is half opened and a conductive material 7 capable of forming a circuit pattern is deposited onto said magnetic latent image. Said magnetic material 7 should be ferromagnetic and soft magnetic with a low retentive magnetic flux, since said material has to be magnetically attractable for forming a magnetic image and should be free of magneticity after the image is transferred. Such magnetic material is, for example, Fe, Co or Ni powder.

Figure 3:
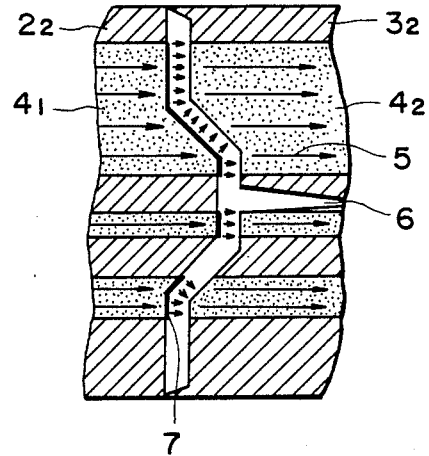
Figure 4:
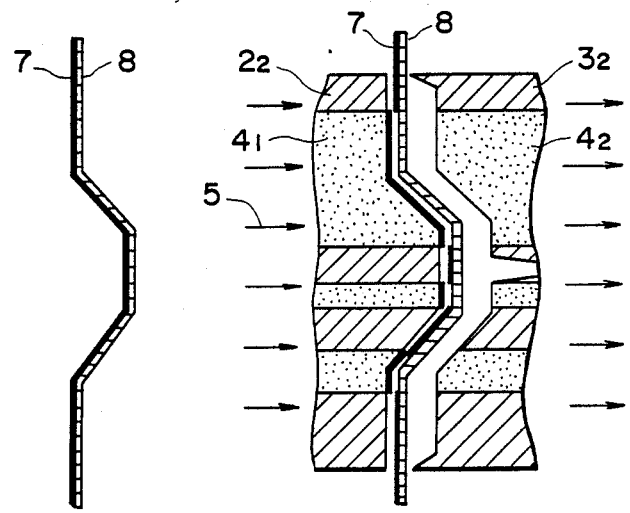

FIG. 3 shows the details of the cavity and the vicinity wherein said material 7 is deposited, and there are shown trajectories of the magnetic flux in the cavity and in the vicinity thereof. The counter magnetic pole $4_2$ performs a function of rendering the magnetic flux on the circuit pattern forming portion $4_1$ perpendicular to the cavity face. Such perpendicular magnetic flux to the cavity face provides uniform magnetic flux density over the entire circuit pattern forming portion $4_1$, thus forming an evident contrast between said portion and other portions, and realizes a uniform distribution of the material deposited on said portion.

A circuit pattern is thus formed with the magnetic material on the cavity face of the movable male mold 2 according to the magnetic image, but magnetic material may also deposit on the cavity face of the fixed female mold as it also has magneticity.

In order to avoid deposition of the magnetic material on the cavity face of the fixed female mold 3, there may be employed a supply method in case the magnetic material is powder. The magnetic material is electrostatically deposited on a thin plate 8, for example of acrylic resin, which has a form similar to that of the molded article and which can be inserted in a small gap of the parting line of the mold. The magnetic material deposited on said plate 8 is positioned at the movable side, maintained on the parting line and the mold is subjected to a magnetic field. Thus the magnetic material deposited electrostatically on the plate 8 moves in the air, by the stronger force of said magnetic field, to the cavity face of the male mold and deposited on the magnetic circuit pattern. No deposition takes place on the female mold in this case, since no magnetic material is present on the side of said female mold. Also the magnetic material facing an area outside the circuit pattern is not deposited by said electrostatic force. Thus this process only allows deposition of the magnetic material on the circuit pattern of the male mold even if the cavity face of the female mold is magnetized.

Figure 5A:
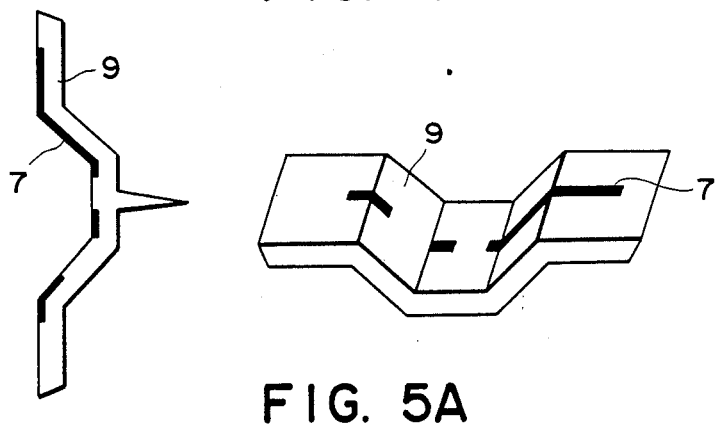

Then, after the molds are mutually tightened, fused resin is injected through the sprue. After cooling, the molds are opened, and the obtained molded article 9 has a pattern of the magnetic material 7 transferred to the surface thereof, as shown in FIG. 5A.

Figure 5B:
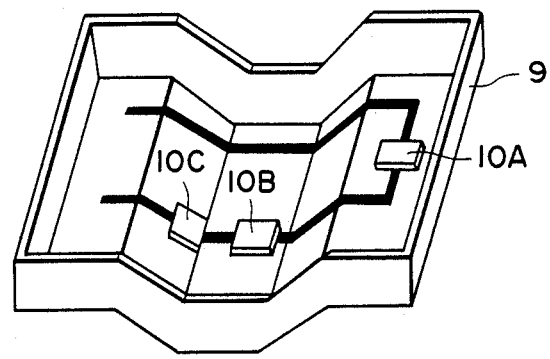

FIG. 5B shows an example in which circuit elements 10A, 10B, 10C are directly fixed on the surface of an article 9 molded according to a process shown in FIGS. 2 to 5A.

The aforementioned magnetic material also contains a binder component such as a Ni-acrylic conductive paint manufactured by Fujikura Kasei Co. Said binder does not function in the formation of the magnetic image, but in the injection molding of the resin molded article. The binder contained in the magnetic image constituting the circuit pattern is easily fused or softened by the high temperature and high pressure of the injected resin. In the cooling step of the molded article, the binder is also cooled and solidifies, so that the magnetic image is transferred from the cavity face to the molded article. Since the binder is fused to the resin of the molded article, the transferred circuit pattern has a very strong adhesion to the molded article.

The foregoing explanation has been limited to the formation of an electric circuit, but the present invention is not limited to such embodiment and is applicable to the manufacture of irregular resin molded products for example those with surface decorative designs by replacing the magnetic pattern or magnetic material. Also the present invention is applicable to RIM molding, LIM molding, cast molding etc. in addition to injection molding.

As explained in the foregoing, the present invention allows to form a circuit pattern on the irregular surface of a resin molded article simultaneous with the molding and without any secondary process, by magnetically forming a circuit pattern with a magnetic material on the cavity face of a mold composed a magnetic portion and a non-magnetic portion. Also the circuit need not be positioned with respect to the molded article in the molding operation, and is satisfactorily adhered to the molded article.

Now reference is made to FIGS. 6 to 12 for explaining a process in which the patterning material is coated with a mask member.

Figure 6:
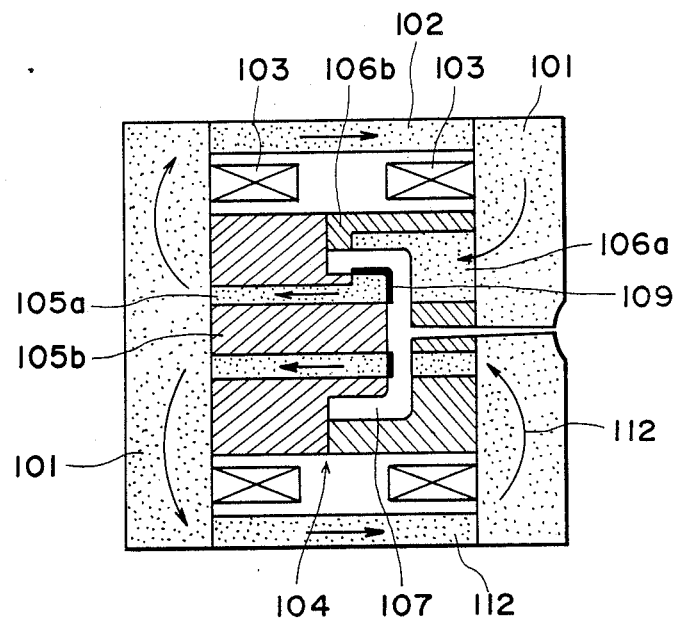

FIG. 6 shows a magnetic circuit composed of a mold 104 and an exciting coil 103 mounted on a molding machine. The mold 104 is composed of a movable mold plate 105 and a fixed mold plate 106, and a pattern forming portion on the surface of a cavity 107 is composed of magnetic members 105a, 106a such as of carbon steel, while other portions are composed of non-magnetic members 105b, 106b for example of SUS 303. A platen 100 and a tie bar 102 of the molding machine are respectively composed of magnetic materials such as carbon steel. When energized, the exciting coil 103 generates magnetic flux 112 as indicated by arrows to generate a magnetic force on the surface of the magnetic members 105a, 106a of the cavity 107, whereby magnetic powder 109 can be attracted and deposited on said surface.

Figures 7, 8:
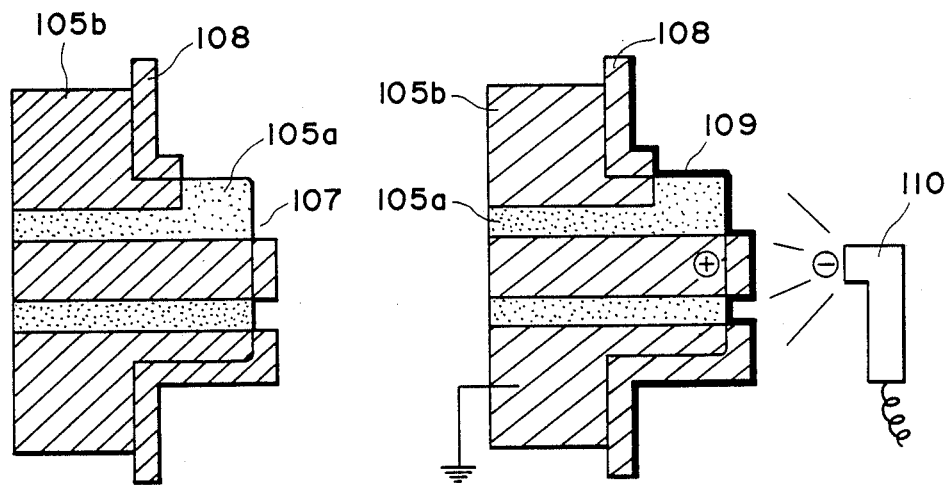

At first the movable mold plate 105 is opened as shown in FIG. 7, and a mask 108 is positioned to mask the cavity of the non-magnetic portion 105b, thereby exposing the magnetic portion 105a only, onto which the magnetic powder is to be deposited. Said mask 108 is composed for example of a metal, rubber or plastics and fixed on the movable mold plate 105 by suitable means.

Then, as shown in FIG. 8, an electrostatic painting machine 110 is used for coating the exposed portion of the cavity face and the mask 108 with magnetic powder 109. Said magnetic powder is composed of a ferromagnetic conductive material and a binder component, and is obtained for example by mixing 90 wt. % of nickel powder of an average particle size of 2–3 μm and 10 wt. % of acrylic resin powder as the binder component, in the fused state of said binder, then cooling the mixture and crushing said mixture into powder with an average particle size of 30 μm. For said nickel powder there can be employed a product called Type 255 supplied by Inco Limited Japan, and for said acrylic resin there can be employed a product called Finedic A224S supplied by Dai-Nippon Ink Chemical Industries Co. The magnetic powder 108, when negatively charged with a voltage of 70 kV by the electrostatic painting machine 110 and coated on the grounded mold, is deposited on the magnetic portion 105a and on the mask 108, by the electrostatic force between said mold and powder.

Figure 9:
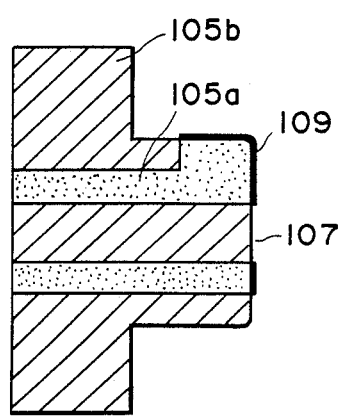

Then the mask 108 is removed from the movable mold plate 105. Thus, as shown in FIG. 9, the magnetic powder 109 forms a pattern only on the surface of the magnetic portion 105a of the cavity 107.

Figure 10:
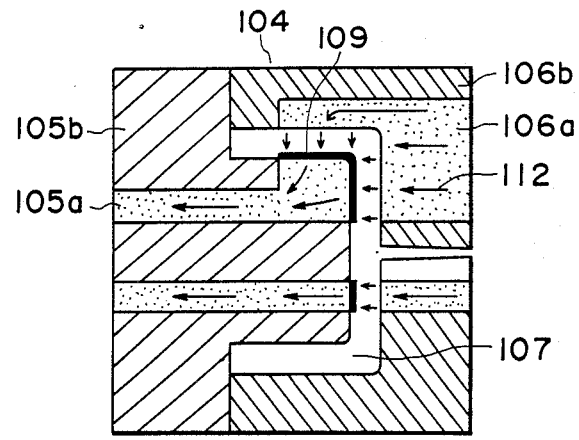

Then, as shown in FIG. 10, the mold 104 is closed and the coil 103 is energized, thereby generating a magnetic force on the surface of said magnetic portion 105a as explained before and firmly holding the already deposited magnetic powder 109 by magnetic attraction. Subsequently a resin material 111 is injected in the cavity. Said injected resin 111 fills the cavity in such a manner that said magnetic powder 109 is embedded in the resin while it is supported by electrostatic attraction in a predetermined position of the cavity. Also the binder component, such as acrylic resin, contained in the magnetic powder 109 is softened or fused by the high temperature and high pressure of the injected resin 111, and solidifies simultaneously with the cooling of the injected resin so that the binder and the resin of the molded article show very strong mutual adhesion.

Figure 11:
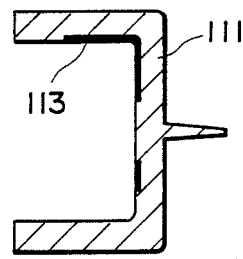

FIG. 11 shows a molded article removed from the mold after cooling. The pattern of the magnetic powder 109 formed on the face of the cavity 109 prior to molding is embedded in the injected resin 111 and transferred as a circuit pattern 113 on the surface of the molded article.

In an example an exciting coil of 346 turns was energized with a current of 60 Amperes, and polystyrene resin of 200° C. was injected from an injecting cylinder with a pressure of 340 kg/cm$^2$ into the cavity. Thus there was obtained a molded article, bearing a circuit pattern of a surface resistivity of 1 Ω/cm$^2$ formed by the transfer of said magnetic powder to a predetermined position.

Thus the present invention allows to form a circuit on the irregular surface of a resin molded article simultaneous with the molding operation and without any secondary work step, by depositing magnetic powder by electrostatic coating on a cavity face of a mold composed of magnetic and non-magnetic portions to obtain a pattern, and molding resin material while magnetically maintaining said magnetic material. Also there is obtained a circuit with satisfactory adhesion to the molded article.

Figure 12:
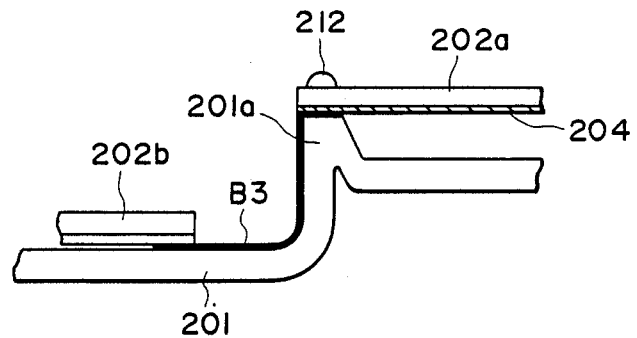
Figures 13A, 13B:
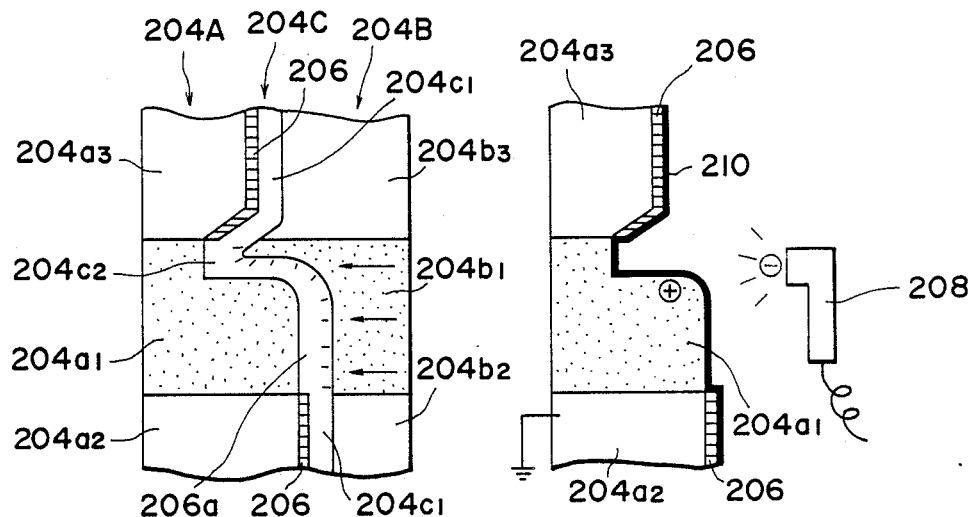
Figures 13C, 13D:
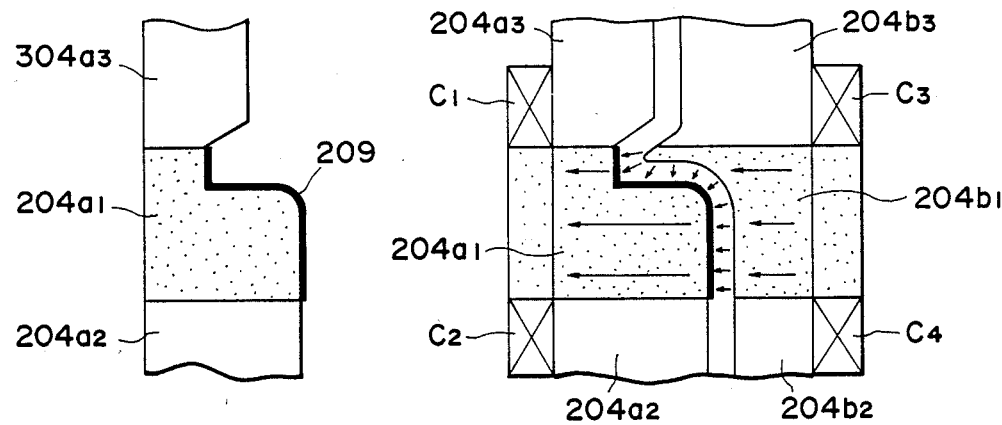
Figure 13E:
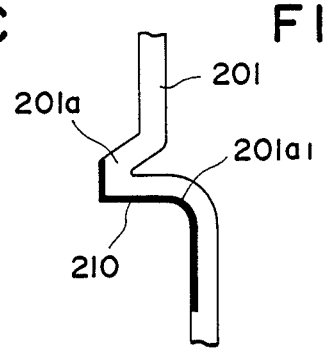

Now reference is made to FIGS. 12 to 13E for explaining an example of electric circuit assembly employing a resin molded article obtained with the above-explained processes.

FIG. 12 is a schematic cross-sectional view in which circuit boards 202a, 202b are electrically connected to a molded article 201. Said molded article 201 constitutes a part of a body of a cover of the electric equipment or an intermediate member to be mounted on said cover or body, and is further provided with a projection 201a.

Figure 1:
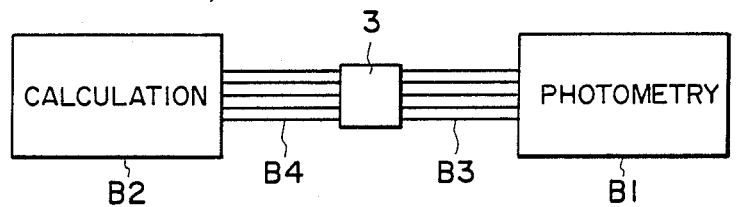
FIG. 1 is a block diagram showing a conventional method of electric assembly employed in the conventional electric equipment.

A circuit pattern B3, corresponding to the circuit pattern shown in FIG. 1, is formed on the surface of the molded article 201, utilizing a mold for said article. A circuit pattern 202a, formed on the circuit board 202, constitutes a part of the circuit block B1 shown in FIG. 1.

FIGS. 13A to 13E illustrate a process for forming the molded article 201, wherein shown is a mold 204 composed of a fixed mold plate 204A and a movable mold plate 204B, which are in turn composed of magnetic portions 204a$_1$, 204b$_1$ and non-magnetic portions 204a$_2$, 204a$_3$, 204b$_2$, 204b$_3$ and constitute a cavity 204c for forming said molded article. Said cavity 204c is composed of a portion 204c$_1$ for forming a flat portion of said body or cover, and a portion 204c$_2$ for forming a projecting internally from said flat portion.

On said mold plates 204A, 204B there are mounted coils C1–C4 for generating magnetic flux as shown in FIG. 13D.

A mask member 206 has an aperture 206a for covering the surface of the non-magnetic portions 204a$_2$, 204a$_3$ of the mold plate 204A and exposing areas where the circuit pattern B3 of the cavity 204C is to be formed. Said mask member 206 is formed with a material same as that of said non-magnetic portion of the mold plate 204A, and is fixed to the non-magnetic portions 204a$_2$, 204a$_3$ with suitable means.

After the mask member 206 is fixed in the cavity of the mold plate 204A, a circuit patterning material 210 composed of magnetic powder is coated in said cavity, bearing said mask member 206, by means of a painting machine 208 as shown in FIG. 13B.

Said circuit patterning material 210 is prepared by mixing 90 wt. % of nickel powder of an aveparticle size of 2–3 μm and 10 wt. % of acrylic resin powder in the thermally fused state thereof, and crushing the cooled mixture to powder with an average particle size of 30 μm. The nickel powder employed in said powder 210 can be composed of a product called Type 225 supplied by Inco Limited Japan, and the acrylic resin powder can be composed of a product called Finedic A224S supplied by Dai-Nippon Ink Chemical Industries Co. The powder thus obtained is emitted in negatively charged state from the painting machine 208 supplied with a voltage of −70 kV onto the mask 206, whereby, as shown in FIG. 13B, the powder is attracted, by the electrostatic force, to the internal face of the cavity of the mold plate 204A. After said powder coating, the mask 206 is removed to obtain a circuit pattern formed by said powder 210 on the surface of the magnetic portion $204a_1$. Subsequently the movable mold plate 204B is closed, and the exciting coils are energized, whereby a magnetic circuit is formed through the magnetic portion $204a_1$ of the mold plate 204A, the magnetic portion $204b_1$ of the mold plate 204B, and the powder 210, thus enhancing the adhesion of powder to the mold plate.

The magnetic force of said magnetic circuit was for example obtained by supplying a current of 60 A in a coil of 346 turns.

Subsequently polystyrene resin fused at 200° C. was injected, from an unrepresented injecting cylinder, with a pressure of 340 kg/cm² into said cavity. The cavity of the mold plates 4A, 4B are so formed as to obtain a projection 201A in the molded article as shown in FIG. 13A. When said resin is injected into the cavity with the above-mentioned pressure, the powder 210 is maintained on the predetermined position of the magnetic portion $204a_1$ of the mold plate 204A by means of the aforementioned magnetic and electrostatic force, and the injected resin fills the cavity in such a manner that the circuit pattern formed by said powder 210 is embedded in said resin.

The molded article 201 is taken out of the mold after said resin injection and cooling. As shown in FIG. 13E, the obtained molded article 201 is provided with a circuit pattern B3 composed of the powder 210 and positioned over the projection 201a, a lateral portions $201a_1$ thereof and an internal flat portion of the molded article.

The circuit pattern composed of a copper foil on the board 202a is pressed against the circuit pattern B3 on the end face of the projection 201a of the molded article, and said board 202a is fixed with a screw as shown in FIG. 12. Also the circuit pattern composed of a copper foil on the board 202b is pressed against the other end of the circuit pattern B3 of the molded article 201, and said board 202b is fixed with an unrepresented screw.

In the above-explained structure, the circuit boards 202a, 202b are mutually connected electrically by the circuit pattern B3 integrally formed on the internal surface of the molded article.

It is thus rendered possible to eliminate rigid or flexible circuit boards, lead wires or bound wires for connecting different circuit blocks and to obtain a simple electric circuit assembly, by forming a projecting portion on a body or a cover of an electric equipment involving electric circuits, integrally forming a circuit pattern containing magnetic powder simultaneously with the molding of said projection in a same mold, and electrically connecting said circuit pattern on said projection on with a circuit pattern on a circuit board fixed to said body or cover.

It is also rendered possible to reduce the number of circuit boards or the size thereof, and to resolve the difficulty in making long connections.

Figure 14:
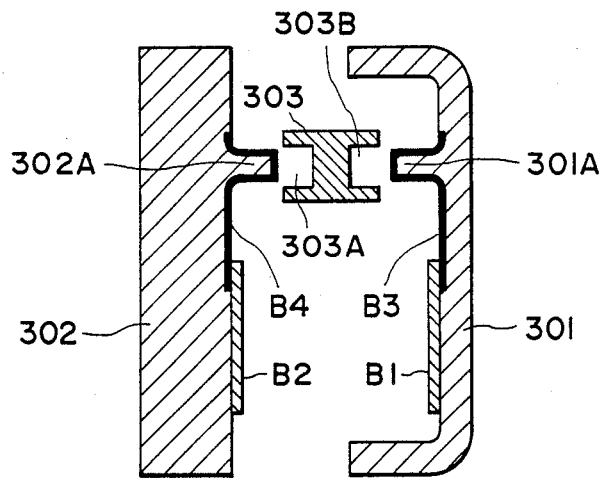
Figure 15:
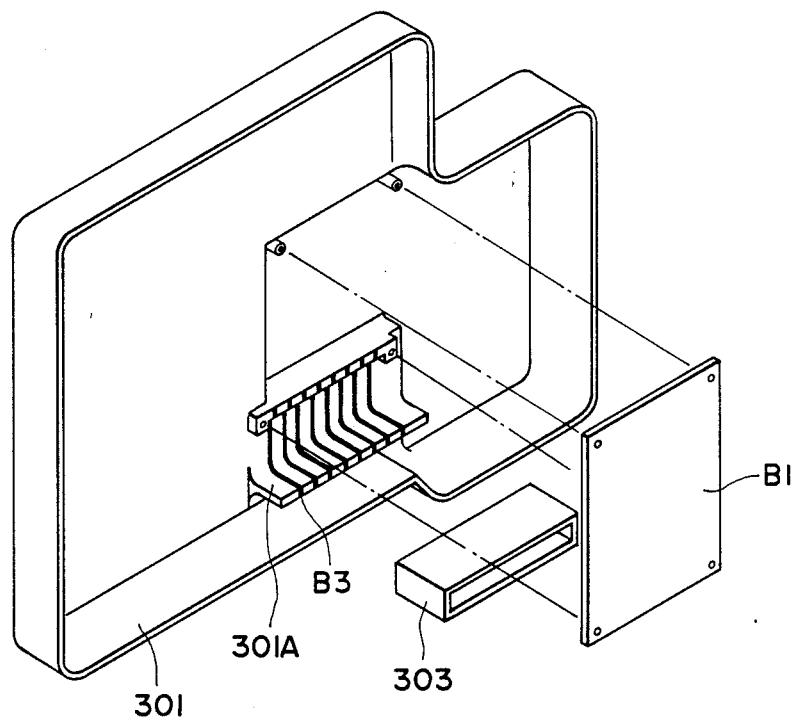
Figures 16A, 16B:
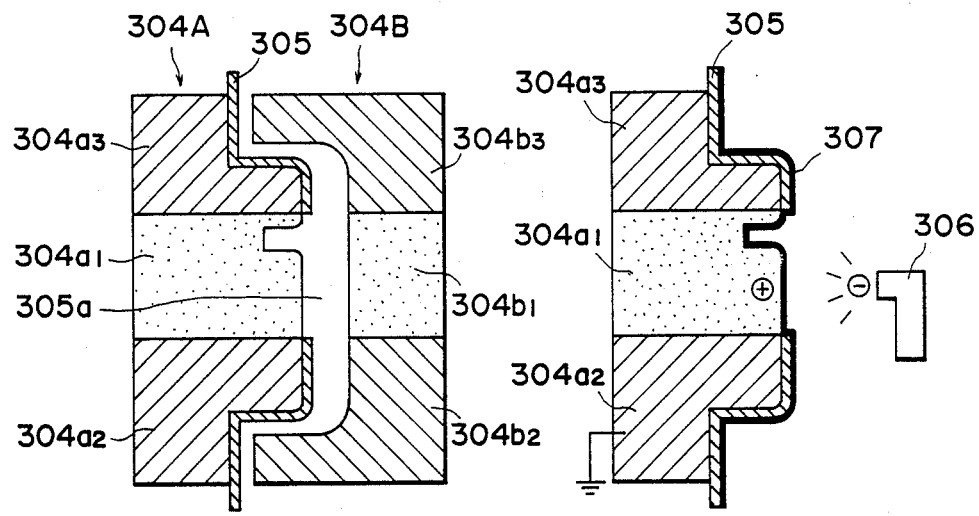
Figures 16C, 16D:
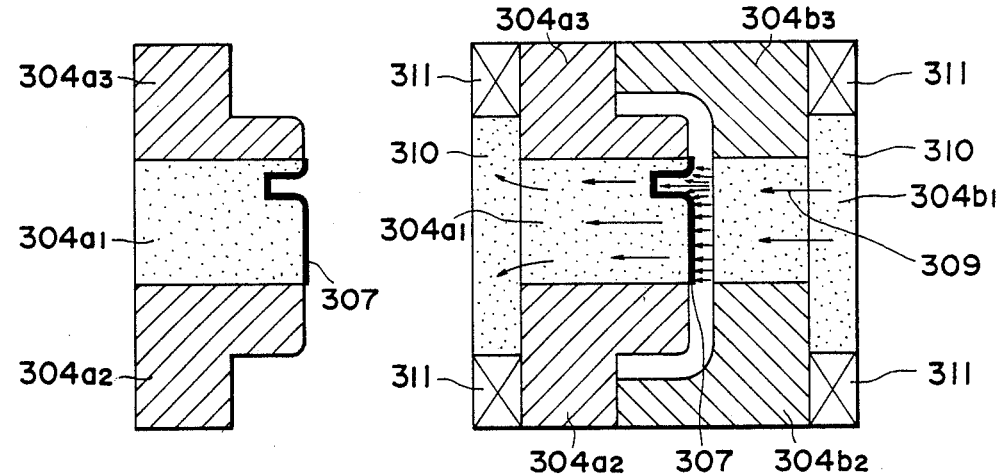
Figure 16E:
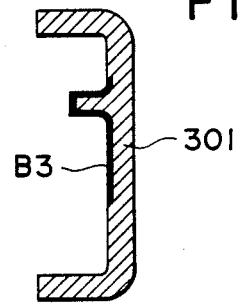

Now reference is made to FIGS. 14 to 16 for explaining a second embodiment of the electric circuit assembly in which a projection is molded with a resin material on the internal surface of a body or a cover of an electric equipment involving electric circuits or an intermediate member thereof, a terminal pattern containing magnetic powder is integrally molded on the surface of said projection simultaneously with the molding or said body, cover or intermediate member in a same mold, and a circuit connector is connected to said projection bearing said terminal pattern.

FIGS. 14 and 15 illustrate this embodiment wherein 301 is a cover of the electric equipment, and 302 is a body or a cover thereof.

Also there are shown a projection 301A formed inside the cover 301; a circuit board B1 provided with a first circuit; and a circuit pattern B3, corresponding to the circuit B3 shown in FIG. 1, of which an end is positioned on a flat plane inside the cover 301 and is electrically connected by pressure contact with an unrepresented circuit pattern of said circuit board B1, and of which the other end is extended from the base of said projection 301A inside the cover through the top of said projection to the base at the other side of said projection.

There are further shown another projection 302A formed on the body 302; a circuit board B2 corresponding to the circuit block B2 shown in FIG. 1; and a circuit pattern B4, formed on the internal surface of the body 302, having an end positioned on a flat plane of the body and maintained in pressure contact with the board B2 for electrical connection with the circuit thereon and the other end extended from the base portion of said projection through the top of said projection to the base portion at the other side thereof. FIG. 15 is a perspective view showing the interior of the cover 301. The pattern B3 is formed on both perpendicular faces of the projection 301A, which constitutes, together with said pattern B3, a male connector for circuit connection.

In FIGS. 14 and 15, a circuit connector 303 is provided with receptacles 303A, 303B for receiving the projections 301A, 302A of said cover or body and is so constructed as to electrically connect the circuit pattern B3 of the cover and the circuit pattern B4 of the body when said projections are inserted into said receptacles of the connector 303.

Now reference is made to FIGS. 16A to 16E for explaining a process for forming the pattern B3 inside the cover shown in FIGS. 14 and 15. There are shown a fixed mold plate 304A and a movable mold plate 304B. The fixed mold plate 304A is composed of a magnetic mold plate $304a_1$, corresponding to the area of circuit pattern B3 shown in FIG. 14, and non-magnetic mold plates $304a_2$, $304a_3$. The movable mold plate 304B is composed of a magnetic mold plate $304b_1$, corresponding to the area of the pattern B3, and non-magnetic mold plates $304b_2$, $304b_3$. Said movable and fixed mold plates form a cavity for molding said cover 301 when said mold plates are mutually tightened.

The molding process in the embodiment shown in FIGS. 14 to 16E, and the patterning material employed therein are same as those in the embodiment shown in FIGS. 12 to 13 and need not therefore be explained further.

Also the body 302 shown in FIG. 14 and the circuit pattern thereon can be integrally molded with the same apparatus and process for molding the cover shown in FIGS. 16A to 16E. The moldings of the body 302 and the cover 301 are different only in the form of cavity due to the difference in the form of the body and the cover, and the integral formation of the circuit pattern B4 and B3 can be achieved in identical manner. In the cover 301 or body 302 formed according to the process shown in FIGS. 16A to 16E, the circuit pattern B3 or B4 is formed from the base portion of the projection 301A or 302A through the top face of said projection to the other base portion thereof, as shown in FIG. 15, integrally with said body or cover and simultaneously with the molding thereof. Thus, when the projections of the cover 301 and the body 302 are inserted into the connector 303, the circuit B1 is electrically connected with the circuit B2, through the pattern B3 inside the cover, the connector 303 and the pattern B4 inside the body.

In the embodiment shown in FIGS. 14 and 15 the projections 301A, 302A are respectively formed on the cover 301 and the body 302 and are mutually connected with the connector 303, but it is also possible to form the projection 302A on the body 302 and insert said projection to a connector connected to an unrepresented circuit board.

Furthermore it is possible to employ an intermediate member to be fixed to the cover 301 or body 302, instead of said cover or body itself, and to integrally form a circuit pattern on said intermediate member in the process shown in FIGS. 16A to 16E.

As explained in the foregoing, the present invention is featured by forming a projection with a resin material on the internal surface of a body or a cover of an electric equipment involving electric circuits or an intermediate member to be fixed to said body or cover and integrally forming a terminal pattern containing magnetic powder on the surface of said projection simultaneously with the molding of said body, cover or intermediate member, and connecting a circuit connector to said projection bearing said terminal pattern, thereby reducing the number of circuit boards and eliminating complex wires between the cover 301 and the body 302.

Also according to the present invention the projection 301A or 302A, bearing the terminal pattern B3 or B4 for connecting with the connector, is provided in a predetermined position of the cover 301, body 302 or intermediate member, so that the position of the connector 303 can also be fixed. It is therefore possible to employ automatic assembling process in the assembly of the electric equipment.

Figure 17:
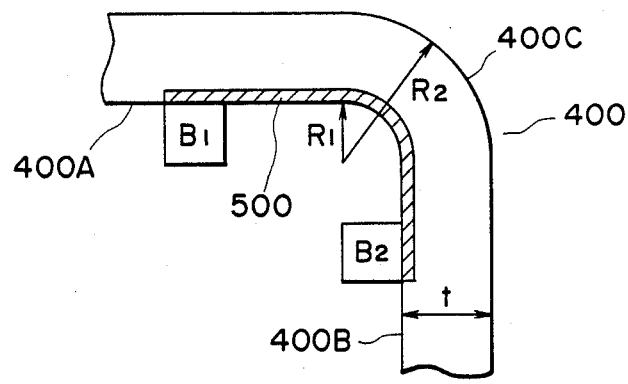
FIG. 17 is a partial cross-sectional view of a resin molded article of the present invention.

FIG. 17 is a partial cross-sectional view of another embodiment of a resin molded article serving as a cover, a case, a body or an intermediate member of an electric equipment involving electric circuits, wherein 400 shows a partial cross section of said molded article. Mutually neighboring faces 400A, 400B of said article 400 are connected with a curved face 400C, and a circuit pattern 500 is formed over said neighboring faces 400A, 400B and said curved face 400C. Circuit blocks B1, B2 shown in FIG. 1 are positioned at respective ends of said circuit pattern 500 and are electrically connected thereto.

Figure 18:
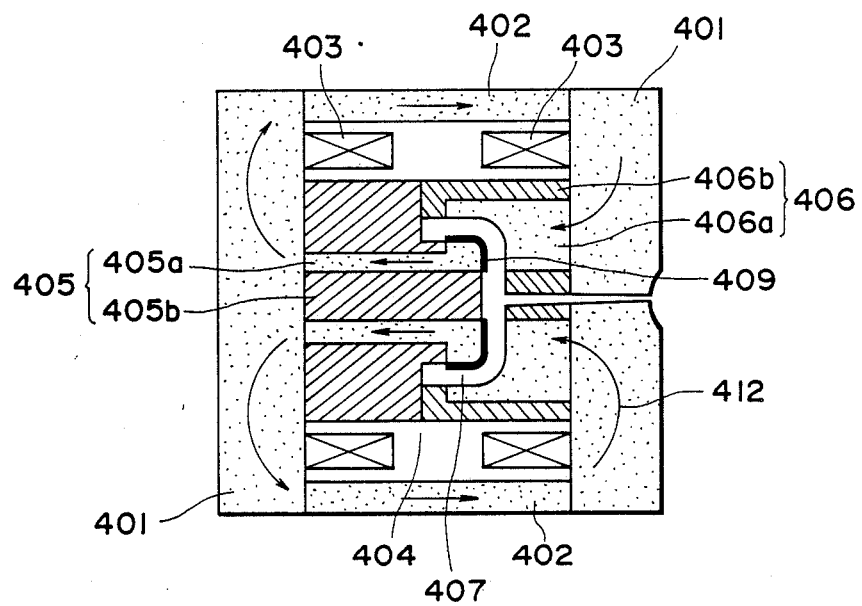
FIG. 18 is a cross-sectional view of a mold.

FIG. 18 is a schematic cross-sectional view of an apparatus for producing the resin molded article shown in FIG. 17, and FIGS. 19A to 19E illustrate a process of molding said article.

FIG. 18 shows a magnetic circuit formed by a mold 404 and an exciting coil 403 mounted on a molding machine. The mold 404 is composed of a movable mold plate 405 and a fixed mold plate 406, and a pattern forming portion on the surface of a cavity 407 is composed of magnetic portions 405a, 406a for example of carbon steel, while other portion is composed of non-magnetic portions 405b, 406b for example of SUS 303. A platen 401 and a tie bar 402 of the molding machine are composed of magnetic materials such as carbon steel. When energized, said coil 403 generates a magnetic flux 412 as indicated by arrows, thereby generating a magnetic force on the surface of the magnetic portions 405a, 406a of the cavity 407 and depositing magnetic powder 409 to the cavity surface by magnetic attraction.

In the mold structure shown in FIG. 18, corner portions 405a', 406a' of the mold plates 405a, 406a constituting the cavity 407 are formed as curved surfaces of radii R1, R2. Said radii R1 and R2 are preferably selected to satisfy a relation $R2-R1=t$, wherein t is the thickness of the resin molded article 400. Also preferably the thickness of the flat portions 400A, 400B of the resin molded article is selected equal to that of the curved portion 400C.

FIGS. 19A to 19E show a process for producing the resin molded article of the present embodiment.

At first the movable mold plate 405 is opened as shown in FIG. 19A, and a mask 408 is placed on the cavity face of the non-magnetic portion 405b, thus exposing the magnetic portion 405a on which the magnetic powder is to be deposited. Said mask 408 can be formed for example of metal, rubber or plastics and is fixed to the movable mold plate 405 by suitable means.

Then, as shown in FIG. 19B, the exposed portion of the cavity face and the mask 408 are coated with the magnetic powder 407 by means of an electrostatic painting machine 410. Said magnetic powder is composed of a ferromagnetic conductive material containing a binder component, and can be obtained, for example, by mixing 90 wt. % of nickel powder of an average particle size of 2-3 $\mu$m and 10 wt. % of acrylic resin powder as the binder component, in the thermally fused state of the binder component, and crushing the cooled mixture to powder with an average particle size of 30 $\mu$m. For said nickel powder there can be employed a product called Type 255 supplied by Inco Limited Japan, and for said acrylic resin there can be employed a product called Finedic A224S supplied by Dai Nippon Ink Chemical Industries Co. When said magnetic powder 408, charged negatively with a voltage of $-70$ kV, is coated with the electrostatic painting machine 10 onto the grounded mold, said powder is deposited on the magnetic portion 405a and the mask 408 by the electrostatic force between the powder and the mold.

Then the mask 408 is removed from the movable mold plate 405 to obtain a pattern of said magnetic powder 409 solely on the surface of the magnetic portion 405a in the cavity 407 as shown in FIG. 19C.

Subsequently, as shown in FIG. 19D, the mold 404 is closed and the coil 403 is energized, whereby a magnetic force is generated on the surface of the magnetic portion 405a, thus firmly maintaining the already deposited magnetic powder 409 by magnetic attraction. Then a resin material is injected in the cavity. Said resin fills the cavity in such a manner that the magnetic powder is embedded in the injected resin, while said powder is maintained in the predetermined position in the cavity by the magnetic and electrostatic attractive force. The binder component, such as acrylic resin, contained in the magnetic powder 409 is softened or fused by the high temperature and high pressure of the injected resin 411, and solidifies simultaneously with the cooling of said resin, thus realizing very strong adhesion between the binder component and the molded resin.

FIG. 19E shows the molded article taken out of the mold after cooling. The pattern of the magnetic powder 409 formed on the cavity face of the mold prior to molding operation is transferred as a circuit pattern 413 embedded on the surface of the injected resin 411 constituting the molded article.

As an example a coil 403 of 346 turns was energized with a current of 60 A, and polystyrene resin of 200° C. was injected from an injecting cylinder with a pressure of 340 kg/cm$^2$ into the cavity. There was obtained a molded article bearing a circuit pattern of a surface resistivity of 1.0 $\Omega$/cm$^2$ formed by the transfer of said magnetic powder to a predetermined position.

In this manner the circuit pattern 500 can be formed simultaneously with the molding of the article 400. Integrated circuits constituting the circuit blocks B1, B2 are respectively connected to the end portions of said circuit pattern 500.

As explained in the foregoing, the present invention allows to eliminate the conventional flexible circuit board and to simplify the assembling operation by placing circuit blocks B1, B2 on mutually neighboring flat portions of a resin molded article and electrically connecting said circuit blocks with a circuit pattern 500 formed simultaneously with the molding of said resin molded article.

Also according to the present invention said neighboring flat portions of the resin molded article are connected with a curved portion, thereby avoiding insufficient adhesion of the magnetic powder in such connecting portion and thus improving the reliability of the circuit pattern 500.

Furthermore, said curved portion 400C may be replaced by a slanted planar portion 400c' shown in FIG. 20.

What I claim is:

1. A process for manufacturing a resin molded article bearing a circuit pattern on its surface, comprising the steps of:

preparing a mold member having a cavity for molding the resin molded article, wherein the cavity is defined by a member for generating a magnetic path and a non-magnetic member;

applying a magnetic attractive force to the magnetic path generating member to form a magnetic pattern corresponding to a circuit pattern;

positioning a support member, having a magnetic material, proximate to the magnetic path generating member, wherein the magnetic attractive force applied thereto forms a magnetic pattern on the magnetic path generating member to transfer the magnetic material form the support member to correspond to the circuit pattern; and injecting resin material into the cavity to mold the resin molded article, wherein the magnetic pattern is deposited on the surface of the molded resin article to make the circuit pattern.

2. A process for manufacturing a resin molded article, comprising the steps of:

preparing a mold member having a cavity for molding a resin molded article, wherein the cavity is defined by a member for generating a magnetic path which corresponds to a circuit pattern and a non-magnetic member;

applying a magnetic force to the magnetic path generating member to form a magnetic pattern corresponding to the circuit pattern;

covering a surface defining the cavity with a mask having an aperture corresponding to the circuit pattern;

electrostatically painting the cavity with a pattern material for generating the circuit pattern, wherein the pattern material comprises a conductive magnetic powder mixed with a resin binder, and the powder is attracted to the aperture of the mask by applying a negative voltage to the powder and grounding the mold member to create an electrostatic attractive force;

removing the mask, wherein the pattern material is held on the magnetic path by the electrostatic attractive force and the magnetic force; and injecting a resin material having a high temperature at a high pressure into the mold member, wherein the pattern material is deposited on the surface of the resin material.

* * * * *

UNITED STATES PATENT AND TRADEMARK OFFICE
CERTIFICATE OF CORRECTION

PATENT NO. : 4,935,174
DATED : June 19, 1990
INVENTOR(S) : Osamu Suzuki

It is certified that error appears in the above-identified patent and that said Letters Patent is hereby corrected as shown below: ON TITLE PAGE:

[56]     References Cited

Under "U.S. PATENT DOCUMENTS"

Line 8, "4,218,724   8/1980   Kaufaman" should read
--4,218,724   8/1980   Kaufman--.

COLUMN 12:

Line 13, "form" should read --from--.

Signed and Sealed this

Thirty-first Day of March, 1992

Attest:

HARRY F. MANBECK, JR.

Attesting Officer     Commissioner of Patents and Trademarks